United States Patent
Van Wijck et al.

(10) Patent No.: US 6,240,875 B1
(45) Date of Patent: Jun. 5, 2001

(54) VERTICAL OVEN WITH A BOAT FOR THE UNIFORM TREATMENT OF WAFERS

(75) Inventors: Margreet Obertine Anne-Marie Van Wijck, Heverlee (NL); Rudi Wilhelm, Leuven (BE); Ernst Hendrik August Granneman, Hilversum (NL)

(73) Assignee: ASM International N.V., Bilthoven (NL)

(*) Notice: Subject to any disclaimer, the term of this patent is extended or adjusted under 35 U.S.C. 154(b) by 0 days.

(21) Appl. No.: 09/348,364

(22) Filed: Jul. 7, 1999

(51) Int. Cl.$^7$ ............................................. C23C 16/00
(52) U.S. Cl. ............................................ 118/728; 118/725
(58) Field of Search ........................................ 118/728, 715, 118/725, 500

(56) References Cited

U.S. PATENT DOCUMENTS 5,064,367 * 11/1991 Philiposssian .................. 432/253
5,217,560    6/1993 Kurono et al. .

FOREIGN PATENT DOCUMENTS 56-155529  12/1981  (JP) .

OTHER PUBLICATIONS

J. Electrochem. Soc., vol. 140, No. 10, Oct. 1993, The Electrochemical Society, Inc., The Formation Mechanism and Step Coverage Quality of Tetraethylorthosilicate–SiO$_2$ Films Studies by the Micro/Macrocavity Method, Sorita, et al.

* cited by examiner

Primary Examiner—Richard Bueker
Assistant Examiner—Enh Fieler
(74) Attorney, Agent, or Firm—Knobbe, Martens, Olson & Bear, LLP

(57) ABSTRACT

Method for the treatment of semiconductor substrates as well as an oven-boat system for this purpose. The oven is embodied as a vertical oven and it is aimed to simultaneously treat a number of substrates arranged one above the other in a boat. To carry out the deposition and such processes at raised temperatures an uniformly as possible, that is, so that each semiconductor substrate substantially undergoes the same treatment, it is proposed on the one hand to vary the ratio of the volume limited by two consecutive armrests and on the other hand the volume limited by screening off the process area and the edge of the substrates from the insertion end of the gas to the discharge end of the gas that flows through the oven.

13 Claims, 4 Drawing Sheets

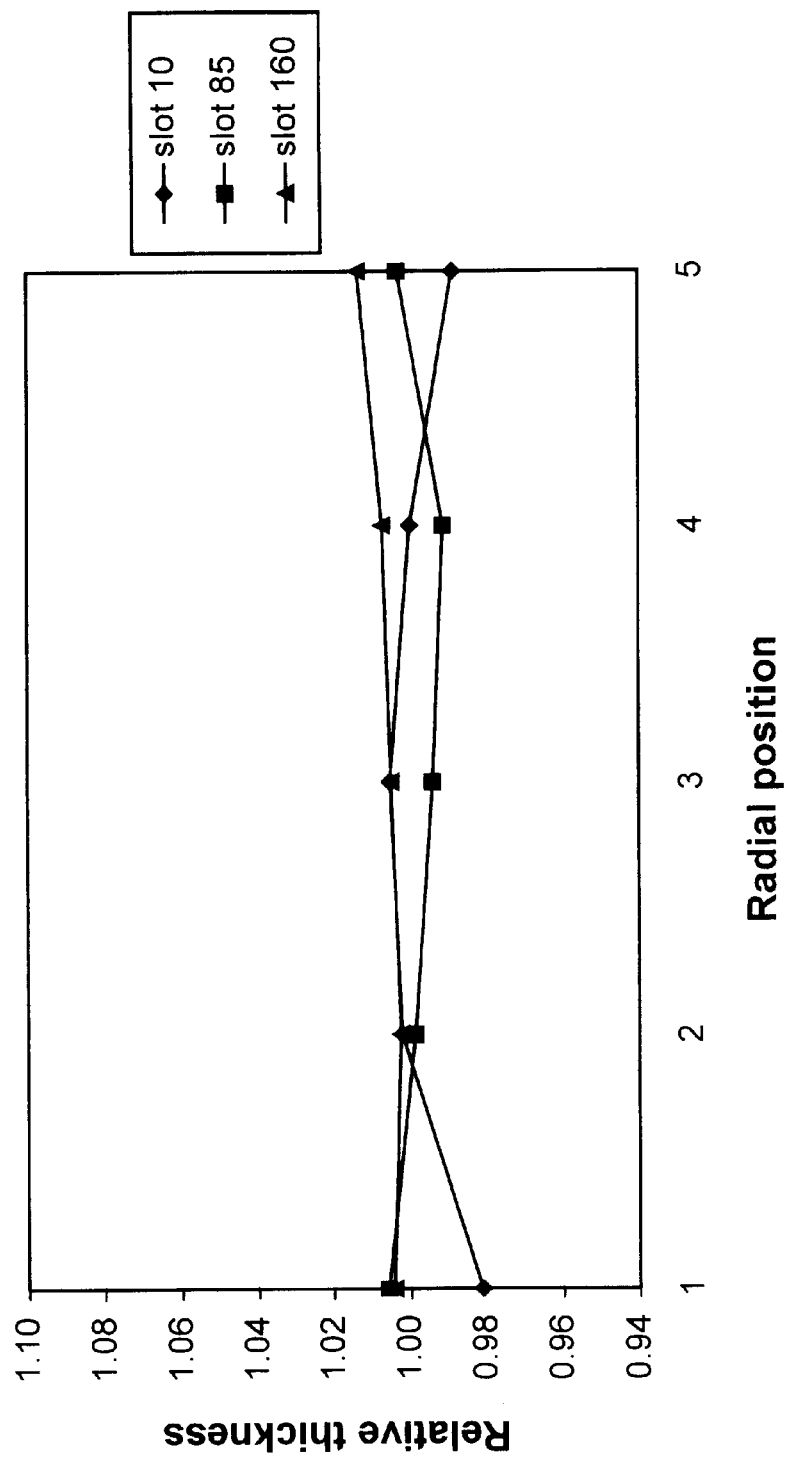

VERTICAL OVEN WITH A BOAT FOR THE UNIFORM TREATMENT OF WAFERS

FIELD OF THE INVENTION

The present invention relates to an apparatus for the uniform treatment of wafers wherein a gas or radicals are supplied during the treatment.

BACKGROUND OF THE STATE-OF-THE-ART

In the state-of-the-art, treatment of groups of semiconductor substrates is well-known. Such a process should be distinguished from systems wherein the wafers are handled separately, that is, one after the other and not simultaneously.

It is clear that a system wherein a large number of wafers (up to several hundreds) are simultaneously treated in a boat, results in a considerable time advantage per wafer, especially for long processes. Naturally, the aim is to treat each of the semiconductor substrates identically, as far as is possible, so that after the treatment all products have been treated in the same way and to the same extent.

One of the problems which can occur is the exhaustion of the treatment gas, which is introduced at one side of the oven. When a layer is deposited by the treatment gas, for example, this layer will generally be thicker at the inflow side than at the side where the gas is removed. This effect can be compensated for by choosing a temperature several degrees higher on the outflow side than on the inflow side. It will be clear that the application of considerable temperature differences in the oven is undesirable, since a difference in treatment does then occur. A particular case occurs with the depositing of silicon dioxide layers from Tetra Ethyl Ortho Silicate (TEOS) vapor. In this case it has been found that, for a relatively high process pressure, high temperature and low TEOS gas flow, the layer thickness on the gas outflow side is smaller than on the gas inflow side, as is to be expected due to the exhaustion of the treatment gas. Nonetheless, for low process pressure, low temperature and high TEOS gas flow, the layer thickness on the outflow side can be thicker than on the inflow side. Likewise, it has been observed that the layer thickness at the edge of the wafer, compared with the layer thickness at the center of the wafer, increases in the direction of the outflow side: depending on the chosen temperature, pressure and TEOS gas flow, the substrate near to the gas inflow side can show a pronounced convex profile in the layer thickness, that is, thinner at the edge than in the center, while under the same circumstances, a substrate near the gas outflow side can show a pronounced concave profile.

The result is that no uniform treatment takes place and, for certain applications, parts of the boat are not filled with wafers, because such an uneven deposition and reaction respectively take place either in the top part or in the bottom part of the boat, compared with the other parts of the boat, that semiconductor substrates are produced which are no longer usable.

The decomposition of TEOS is described in *J. Electrochem. Soc.*, Vol. 140, No. Oct. 10, 1993, page 2952, by T. Sorita, S. Shiga, K. Ikuta, Y. Egashira and H. Komiyama. These authors suggest that the decomposition of the TEOS molecule takes place via the forming of intermediate radicals in the gas phase. These intermediate radicals in turn attach themselves to the wafer and form the silicon dioxide layer. The decomposition rate of the silicon dioxide layer is directly related to the concentration of the intermediate radicals in the gas phase. To achieve a uniform layer thickness over the whole series of semiconductor substrates, the concentration of these intermediate radicals must be constant across the whole reactor. This concentration is determined by the balance between the rate with which the intermediate radicals are formed and the rate with which they are consumed by deposition on the substrates. The rate of the forming is determined by the process conditions, such as pressure, TEOS concentration, temperature and the concentration of already present intermediate radicals. The above-mentioned process results can now be explained as follows. At low pressure, low temperature and high TEOS gas flow, the residence time at the inflow side was too short to build up a sufficient concentration of intermediate radicals. Consequently, under these circumstances, the layer thickness of the inflow side is relatively thin and the layer thickness at the edge of the substrates is relatively thin. During the inward diffusion, a higher concentration of intermediate radicals already forms whereby the layer thickness near the center of the substrate increases. Near the gas outflow side, a high concentration of intermediate radicals has already formed while the exhaustion of the TEOS itself is relatively small. This results in higher deposition speed and a relatively thicker edge. At high pressure, high temperature and low TEOS gas flow, the forming of the intermediate radicals is no longer a limiting factor as the residence time of the gas in the reactor is increased. In this case, the detected layer thickness will show the usual exhaustion characteristics of TEOS: thinner towards the center of the substrates and thinner towards the gas outflow side.

It is noted that the rate of forming of the intermediate radicals in the gas phase is a volume measure. With a higher gas volume, an proportionally larger number of intermediate radicals will form in absolute terms. The 'consumption' of intermediate radicals is determined by the conversion rate in the silicon dioxide layer, and this depends on the temperature and the concentration of the intermediate radicals present. For the decrease in absolute terms, it is the amount of available surface on which the silicon dioxide can form that is important. To summarize, it can be concluded that for a uniform process result, it is important that a balance exists throughout the reactor between the forming of the intermediate radicals, which increase proportionally with the locally available gas volume, and the consumption of the intermediate radicals, which increases proportionally with the available surface. This surface is made up of the surface of the process tube, the boat and the substrates. A balance between volume and surface is thus of fundamental importance. Near the center of the substrate, the ratio of surface to volume is entirely determined by the distance between the substrates. At the edge of the substrates, besides the distance between the substrates, the amount of space between the substrate edge and the process tube is also of importance.

In the abstract of the Japanese patent application 56155529, a boat with a variable pitch is described. With this, according to the description a more even thickness is achieved. In this system the substrates are loaded by hand.

In the U.S. Pat. specification No. 5,217,560, gas or radicals are introduced over the height of the boat from the outside by various openings, to achieve an equal concentration in this way. In this manner, an optimization of the uniformity of the layer thickness can be achieved from the inflow side to the outflow side, but not from the edge to the center of the wafer. Furthermore the complexity of the system increase by the extra gas supply openings and, when used, the amount of gas to be supplied to each of the individual gas openings must be determined and controlled. Such a process with so many parameters is more liable to faults and is undesirable in production circumstances.

SUMMARY OF THE INVENTION

An object of the invention is to avoid these disadvantages and to provide an oven-boat system wherein the variation of layer thickness, both for the height and cross-section of the oven-boat system, is limited as much as possible and wherein the wafers can be loaded by a robot without the necessity to program the position of each individual wafer. Likewise the invention aims to provide a boat which can be used with such an oven-boat system. Furthermore, the invention aims to provide an oven with which the above mentioned can be met.

According to an aspect of the invention, an oven-boat system is provided for the treatment of a number of semiconductor substrates, arranged in a spaced array in an oven, wherein the oven is provided at one end with an insertion opening with a lining tube for delimiting a treatment area, and externally provided with heating elements and an insulating cover wherein means are provided for the insertion of a treatment gas from said end, and means for the removal of gas from said end of the oven, and whereby the boat comprises a number of mutually spaced supports to carry the semiconductor substrates fitted to the frame of the boat such that said disk shaped semiconductor substrates substantially extend in sequence, wherein the distance (pitch) between the consecutive supports changes from the insertion end of the treatment gas to the discharge end in such a way that the difference in distance between adjacent semiconductor substrates is substantially constant. This makes the programming of the robot relatively simple.

According to a further aspect of the invention, an oven-boat system is provided for the treatment of a number of semiconductor substrates arranged in a spaced array in an oven, wherein the oven is provided at one end with an insertion opening which is provided with a lining tube for the confining therein of a treatment area, and externally provided with heating elements and an insulating covering wherein means are present for the insertion of a treatment gas from that end and means for the removal of gas from that end of the oven, and wherein the boat comprises a number of mutually spaced supports, to carry the semiconductor substrates fitted to the frame of the boat such that those disk shaped semiconductor substrates substantially extend in sequence, wherein the cross section surface area of the lining tube changes from the insertion end of the treatment gas to the gas removal end.

According to still a further aspect of the invention, a boat is provided for use in an oven-heat system as described above, comprising a number of mutually spaced supports to carry the semiconductor substrates fitted to the frame of the boat, such that those disk shaped semiconductor substrates substantially extend horizontally and are arranged one above the other in the position of use, wherein the distance (pitch) between the consecutive supports increases from the insertion end of the treatment gas to the gas removal end.

The invention will be elucidated further with reference to an example embodiment shown in the drawings, Wherein:

FIG. 1 schematically shows a first embodiment of the oven-boat system according to the invention;

FIG. 5 shows the results of experiments carried out with an oven-boat system according to FIG. 1.

Figure 1:
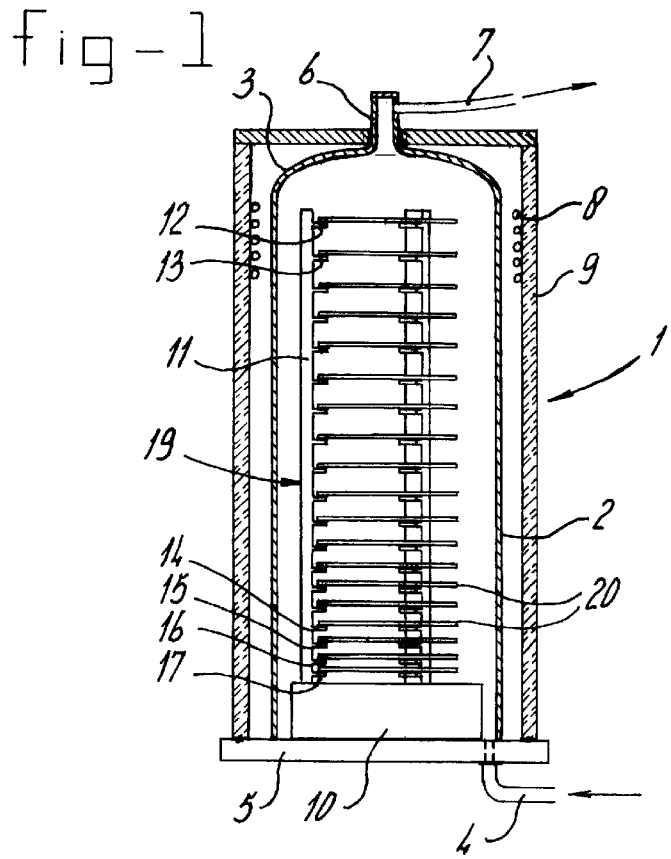

In FIG. 1 a first embodiment of the oven according to the invention is in generally referred to by 1. This is shown here in a very schematic form, and only shows those parts which are essential for the understanding of the invention. Oven 1 consists of the lining tube 2 which is closed at the top side 3 with the exception of the outlet 6 from which the gas outlet 7 branches off. On the underside, the vertical oven is provided with a gas inlet 4. The underside of the oven is provided with an opening which can be closed with a lid 5. On the outside is the lining tube, which can be made from a quartz material, silicon carbide or such like, provided with a heating element 8 as well as insulation 9.

An insulation plug 10 is fitted on lid 5 on which the boat 19 is placed. This boat 19 consists of a frame 11 provided with a number of supports 12–17 to carry the semiconductor substrates 20.

It is clear from FIG. 1 that the distance between supports 16 and 17 is smaller than the distance between supports 14 and 15 which in turn is smaller than the distance between supports 12 and 13. That is, from top to bottom the distance between the supports, and thus the distance between the semiconductor substrates 20 (wafers) which rest on these, decreases. By the moving of gas from gas inlet 4 to gas outlet 7, which gas forms intermediate radicals in the gas phase, the exhaustion of the supplied gas will be compensated for by the larger distance between the semiconductor substrates whereby forming and consumption of the intermediate radicals remains in balance, the concentration of intermediate radicals across the reactor remains substantially constant and the variation of treatment across the oven is limited as much as possible.

The difference in distance occurs with a substantially equal value. Consequently it is possible to program the robot in a relatively easy manner. During the moving of the wafers in and out of the boat system, when moving to the next position, the robot must take into account the changed distance which increases or decreases by a constant value.

Figure 2:
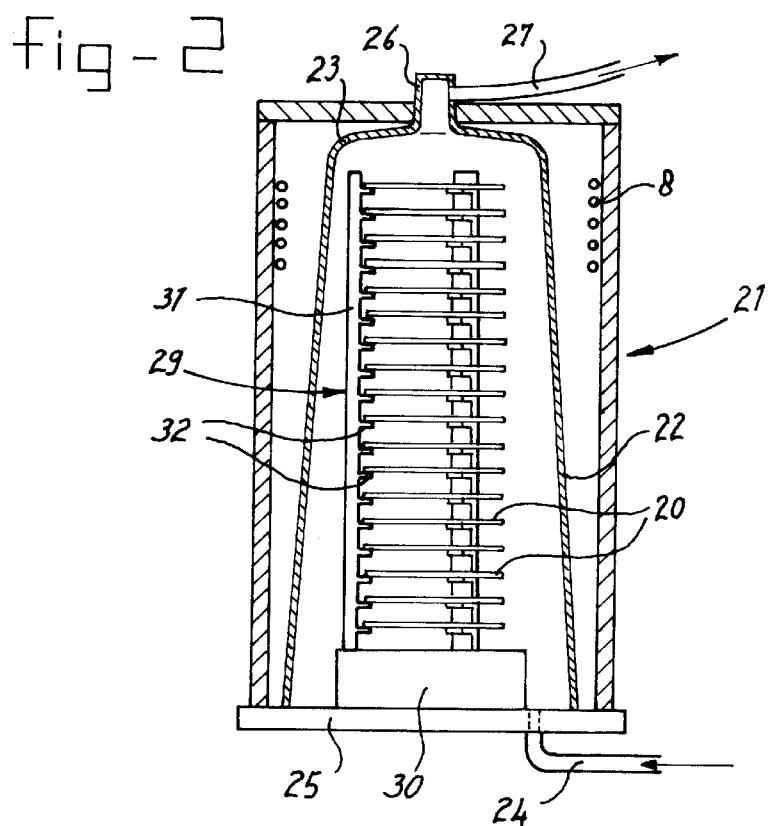
FIG. 2 shows a second embodiment of the oven-boat system according to the invention.

A similar effect can be reached using the construction according to FIG. 2 and/or in combination with the system described above. The oven shown there is indicated by 21 and is provided with a lining tube 22. This is tapered, as is clear from the drawing. The closed top side is indicated by 23 and from there a gas outlet 26 extends which has a branch 27. Gas is supplied via pipe 24 and a lid 25 is present to close the opening on the underside of the oven, with the help of which lid boat 29 is moved in and out of the oven, whereby this boat 29 is positioned on the insulation plug 30 on which the frame 31 of the boat rests. In contrast to the embodiment described above, the distance between the supports 32 fitted on the frame 31 to carry the semiconductor substrate 20 is constant.

During the treatment of the wafers with TEOS, with the gas supply at the underside of the reactor, the layer thickness at the edge of the wafer at this underside of the reactor remains relatively thin in comparison to the layer thickness at the center of the wafer. At the tope side of the reactor, however, the layer thickness at the edge of the wafer is relatively thick. By increasing the volume of gas outside the wafer at the bottom of the reactor and decreasing the volume of gas at the top of the reactor, the variation in layer thickness across the individual wafers is limited.

Likewise it will be understood that for other processes, precisely the opposite measures would have to be taken, that is, when gas passes through, as sketched in the figures, the distance between the wafers in the vertical direction must become smaller or the lining or the oven must taper in the upward direction.

The invention will be further elucidated below with the help of the example embodiments.

Figure 3:
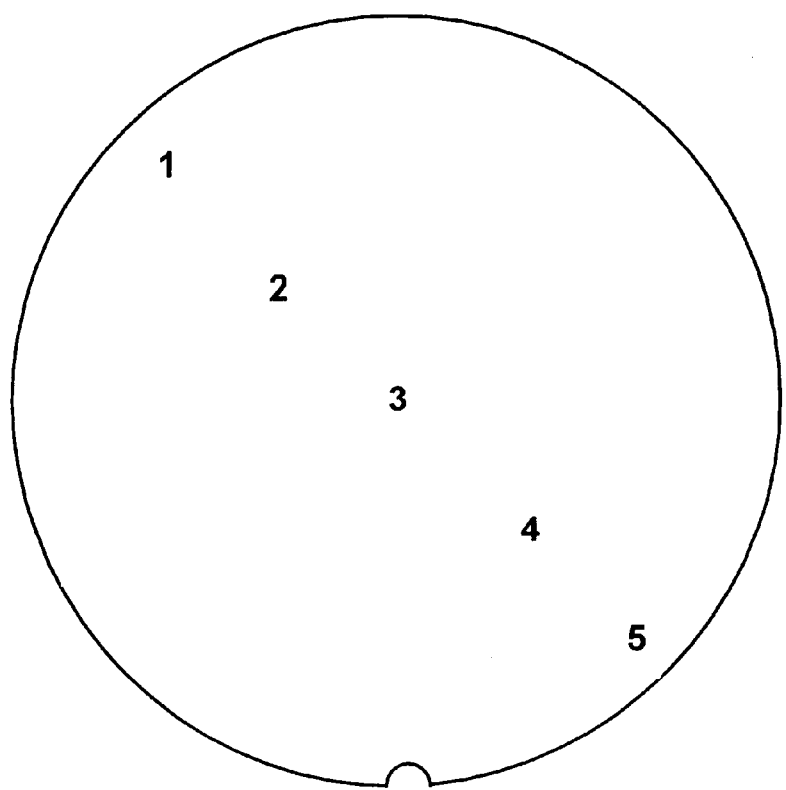
FIG. 3 shows the position of the measuring points on the wafers.

First, the TEOS process was carried out, wherein silicon oxide was deposited on semiconductor substrates embodied in oven-boat system according to the state-of-the-art with the semiconductor substrates spaced out with a constant distance between the disks of 4.78 mm. The diameter of the substrates was 200 mm and there were 167 of them. The temperature was 675° C., the pressure 750 m Torr, while the TEOS gas flow was 200 sccm. When the process had finished, layer thickness measurements were carried out using a PLASMOS ellipsometer. The layer thickness profile across the wafer was determined by measuring the layer thickness at 5 points, as shown in the FIG. 3. Points 1 and 5 are at a distance of 6 mm from the edge of the wafer. The relative layer thickness is plotted in FIG. 4 for three wafers which are at the gas inflow side of the boat, slot 10, halfway up the boat, slot 85, and at the gas outflow side, slot 160. The wafer in slot 10 shows a convex layer thickness profile with a variation in excess of +/−4% while the wafer in slot 160 shows a concave layer thickness profile with a variation in excess of +/−3%.

Figure 4:
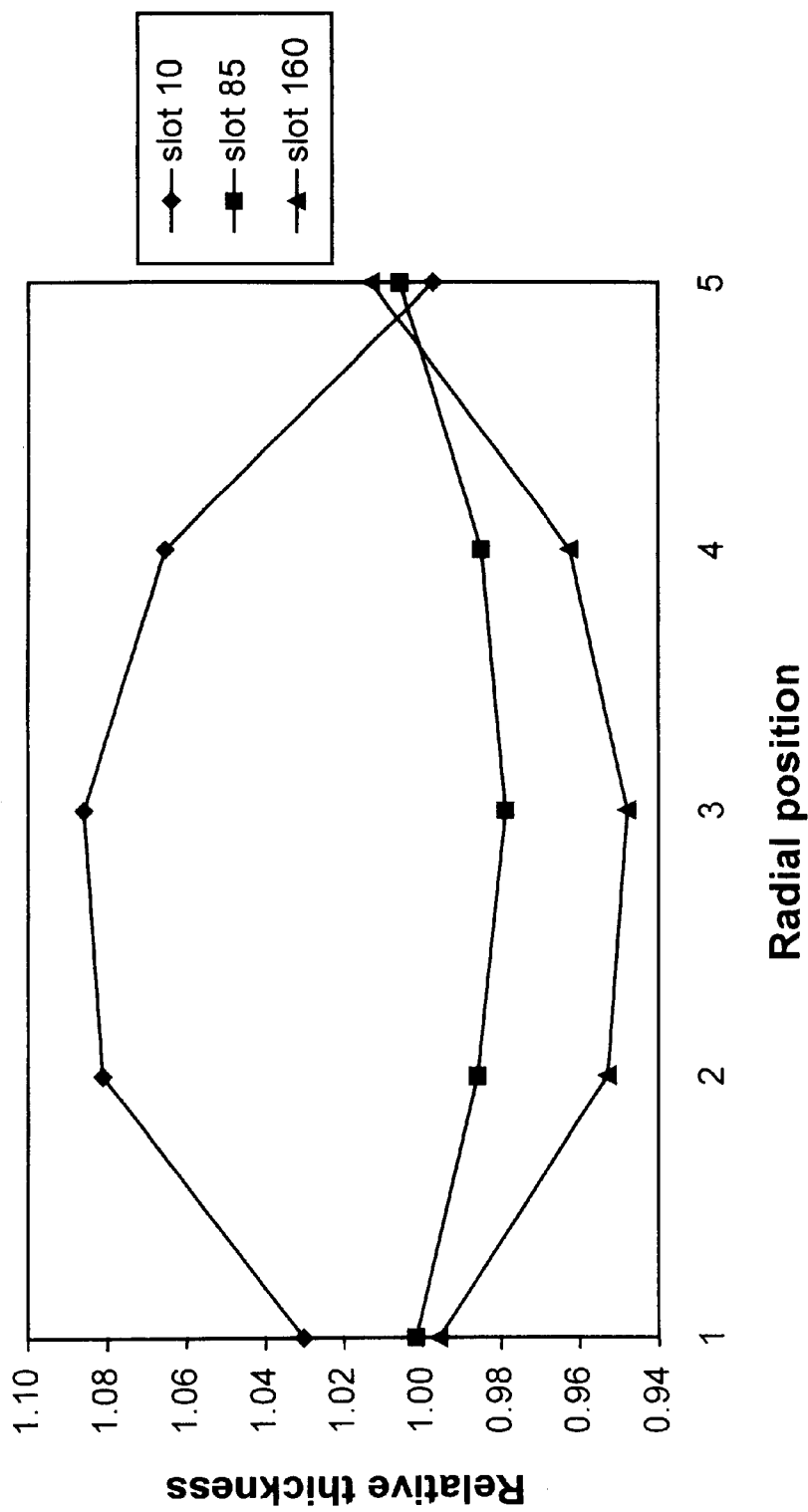
FIG. 4 shows the results of experiments carried out with the oven-boat system according to the state of the art, wherein the wafers have a constant distance between them and the lining tube has a constant diameter end

Next, the TEOS-process was carried out with an oven-boat system according to FIG. 1, wherein the other conditions were chosen as stated above. The relative layer thickness is shown in FIG. 5. The sharp decrease in variation of the layer thickness when compared to FIG. 4 is clear.

In the treatment of wafers with TEOS as described above, the gas is supplied at the underside of the reaction. During the supply of this gas, a reaction occurs whereby the intermediate product is formed. At the inlet for the gas (underside) less intermediate product is present than at the top side (outlet). Consequently, without further measure being taken an unequal deposition takes place. Furthermore, for the wafers at the under side of the oven, the concentration of the intermediate product will increase from the edge to the center. For the wafers at the top of the oven, the concentration of the intermediate product from the wall to the center will decrease. By taking the previously described measures, this concentration gradient can be largely counteracted.

Likewise, it will be understood that for other processes, precisely the opposite measures would have to be taken, that is, when gas passes through, as sketched in the figures, the distance between the wafers in the vertical direction would have to be smaller or the lining of the oven would have to taper in the upward direction.

The amount of available treatment gas in the center of the disk (and thus the amount of deposition in the center) is mainly determined by the volume between the disks; a larger volume, and thus a larger distance between the disks will mean more available treatment gas.

The amount of available treatment gas at the edge of the disk is mainly determined by the volume found between the disks and the shielding of the process area.

By independently varying the volume of treatment gas at the edge of the disks and the of treatment gas in the center of the disks, the difference in the amount of deposition at the edge and the volume of deposition in the center can be decreased.

The described change of the amount of volume can for example take place in two ways, whether or not at the same time. First it possible to enlarge the distance between the semiconductor substrates, that is between the supports. In this way the concentration gradient across the surface of the semiconductor substrate also decreases. Another possibility is the conical or stepped embodiment of the oven tube, so that the distance to the edge of the semiconductor substrate concerned becomes larger or smaller, whereby the available volume from which gas molecules can be deposited, or take part in the reaction in another way, changes.

It is however also possible to fit a dummy surface in some way around the semiconductor substrate so that any exhaustion of the gas near the edge of semiconductor substrate takes place by reacting with this dummy surface and a more uniform concentration is present above the substrate. Such a dummy surface can be present on both the boat and the liner.

The oven-boat system described above can be used for the embodiment of all reactions known in the state-of-the-art, wherein the concentration of the gas or intermediate radicals near the semiconductor substrate is important. Here, the so-called TEOS process is particularly considered, but not exclusively. This is a deposition process whereby tetraethylorthosilicate is used as the treatment gas to deposit silicate on a semiconductor substrate.

It will be understood that the earlier mentioned measures can be combined to achieve optional uniformity. Furthermore it is possible to vary the conical form and the pitch and the change therein, as required by the process. Likewise it is possible to fit an auxiliary surface near the edge of the semiconductor substrate concerned on which material is deposited, whereby the concentration gradient in the horizontal surface of the semiconductor disk is limited as much as possible.

These and further variants are within the reach of those skilled in the state-of-the-art after reading the description above and fall within the scope of the attached claims.

What is claimed is:

1. An oven-boat system for the treatment of a number of semiconductor substrates arranged in an oven, wherein the oven is provided with an insertion end with an insertion opening which is provided with a lining tube for delimiting a treatment area and externally provided with heating elements and an insulating cover wherein means are provided for the insertion of a treatment gas from said insertion end and means for the removal of gas from a discharge and of the oven and wherein a boat comprises a number of mutually spaced supports, to carry the semiconductor substrates fitted to a frame of the boat such that said semiconductor substrates substantially extend in sequence, wherein the distance (pitch) between the consecutive supports changes from the insertion end of the treatment gas to the discharge end, in such a way that the distance between adjacent semiconductor substrates, when moving to the next position, increases by a substantially constant value.

2. An oven-boat system according to claim 1, wherein the planar area of the cross section of the lining tube changes from the insertion end of the treatment gas to the gas discharge end.

3. An oven-boat system according to claim 2, wherein the lining tube is conically shaped.

4. An oven-boat system according to claim 1, wherein the treatment gas comprises a deposition gas.

5. An oven-boat system according to claim 4, wherein the treatment gas comprises tetraethylorthosilicate.

6. An oven-boat system according to claim 1, wherein the planar area of the cross section of the lining tube decreases from the insertion end of the treatment gas to the gas discharge end.

7. A boat for use in an oven-boat system according to claim 1, comprising a number of mutually spaced supports to carry the semiconductor substrates fitted the frame of the boat, such that the semiconductor substrates substantially extend horizontally and are arranged one above the other in the position of use, wherein the distance (pitch) between the consecutive supports increases from the insertion end of the treatment gas to the discharge end such that the difference in the distance between adjacent semiconductor substrates, when moving to the next position, increases by a substantially constant value.

8. An oven-boat system for the treatment of a number of semiconductor substrates arranged in a spaced array in an oven, wherein the oven is provided with an insertion end with an insertion aperture which is provided with a lining tube for delimiting a treatment area and externally provided with heating elements an insulating covering wherein means are present for the insertion of a treatment gas from said insertion end and means for the removal of gas from a discharge end of the oven and wherein a boat comprises a number of mutually spaced supports, to carry the semiconductor substrates fitted to a frame of the boat such that the semiconductor substrates substantially extend in sequence, wherein the planar area of the cross section of the lining tube changes from the insertion end of the treatment gas discharge end so that the distance from the lining tube to the edge of the semiconductor substrate 6 decreases from the insertion end of the treatment gas to the gas discharge end.

9. An oven-boat system according to claim 8, wherein the lining tube is embodied as a cone.

10. An oven-boat system according to claim 8, wherein the treatment gas comprises a deposition gas.

11. An oven-boat system according to claim 10, wherein the treatment gas comprises tetraethylorthosilicate.

12. An oven-boat system according to the claim 8, wherein the planar area of the cross section of the lining tube decreases from the insertion end of the treatment gas to the discharge end.

13. An oven for use in a system according to claim 8 for the treatment of semiconductor substrates wherein the oven comprises a vertical oven provided on the underside with an insertion/removal aperture with a lining tube for delimiting a treatment area and externally provided with heating elements and an insulating covering wherein means are present for the insertion of a treatment gas from the top or underside of the oven and wherein means are present for the discharge of gas from the top or underside of the oven, wherein the planar area of the cross-section of the lining tube decreases from the insertion end of the treatment gas to the gas discharge end, so that the distance from the lining tube to the edge of the semiconductor substrates decreases from the insertion end of the treatment gas to the gas discharge end.

* * * * *

UNITED STATES PATENT AND TRADEMARK OFFICE
CERTIFICATE OF CORRECTION

PATENT NO. : 6,240,875 B1
DATED : June 5, 2001
INVENTOR(S) : Van Wijck et al.

It is certified that error appears in the above-identified patent and that said Letters Patent is hereby corrected as shown below:

Column 6, claim 1,
Line 42, change "and" to -- end --

Signed and Sealed this

Ninth Day of April, 2002

Attest:

JAMES E. ROGAN
Attesting Officer
Director of the United States Patent and Trademark Office